United States Patent
Vincent et al.

(10) Patent No.: US 10,658,303 B1
(45) Date of Patent: May 19, 2020

(54) HIGH ASPECT RATIO CONNECTION FOR EMI SHIELDING

(71) Applicant: NXP USA, Inc., Austin, TX (US)

(72) Inventors: Michael B. Vincent, Chandler, AZ (US); Stephen Ryan Hooper, Mesa, AZ (US); Dwight Lee Daniels, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/183,910

(22) Filed: Nov. 8, 2018

(51) Int. Cl.
*H01L 23/552* (2006.01)
*H01L 21/56* (2006.01)
*H01L 23/495* (2006.01)
*H01L 23/522* (2006.01)
*H01L 23/00* (2006.01)

(52) U.S. Cl.
CPC .......... *H01L 23/552* (2013.01); *H01L 21/56* (2013.01); *H01L 23/49503* (2013.01); *H01L 23/5226* (2013.01); *H01L 24/49* (2013.01); *H01L 2924/1421* (2013.01); *H01L 2924/3025* (2013.01)

(58) Field of Classification Search
CPC ........... H01L 23/552; H01L 2924/3025; H01L 23/5226; H01L 23/49503; H01L 21/56; H01L 2924/1421; H01L 2225/06548; H01L 21/76804; H01L 2224/05087
See application file for complete search history.

(56) References Cited

U.S. PATENT DOCUMENTS

| | | | |
|---|---|---|---|
| 8,018,034 B2 * | 9/2011 | Chi | H01L 23/29 257/660 |
| 8,247,889 B2 | 8/2012 | Liao et al. | |
| 9,691,711 B2 | 6/2017 | Mahajan et al. | |
| 2018/0005957 A1 * | 1/2018 | Vincent | H01L 24/97 |
| 2018/0331011 A1 * | 11/2018 | Rivera | H01L 23/49562 |

OTHER PUBLICATIONS

ASE Group, "Wet QFN shielding Proposal," CDE_SPE ASECL, Oct. 18, 2017, 8 pages.

* cited by examiner

*Primary Examiner* — William F Kraig
*Assistant Examiner* — Khatib A Rahman

(57) ABSTRACT

A packaged semiconductor device includes: a substrate; an semiconductor die attached to a top surface of the substrate; a mold body surrounding the semiconductor die; a tiered through mold via (TMV) comprising: a first recess having a recessed surface within the mold body at a first depth, and a second recess from the recessed surface to a second depth that exposes a ground contact area on a bonding area on the top surface of the substrate, wherein the first depth is greater than the second depth; and a metal shielding layer formed on a top surface of the mold body to form a shielded mold body, wherein the metal shielding layer makes direct contact with at least one sidewall of the first recess, with at least a portion of the recessed surface, with at least one sidewall of the second recess, and with the ground contact area.

20 Claims, 7 Drawing Sheets

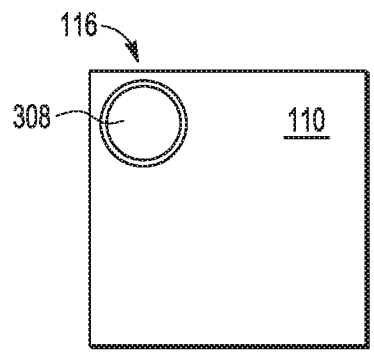 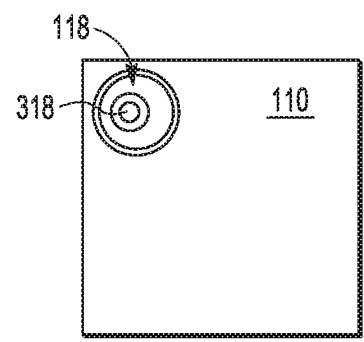
FIG. 3A  FIG. 3C
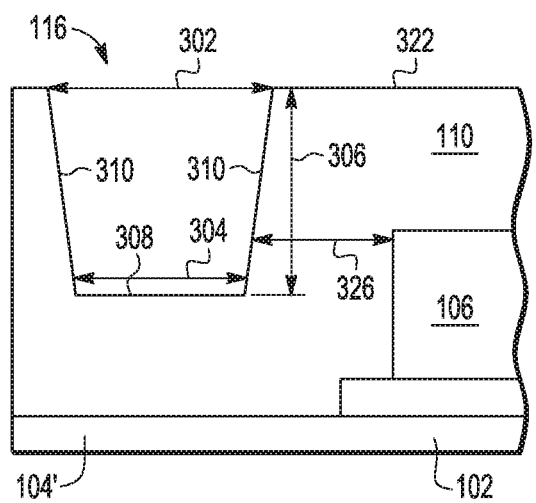 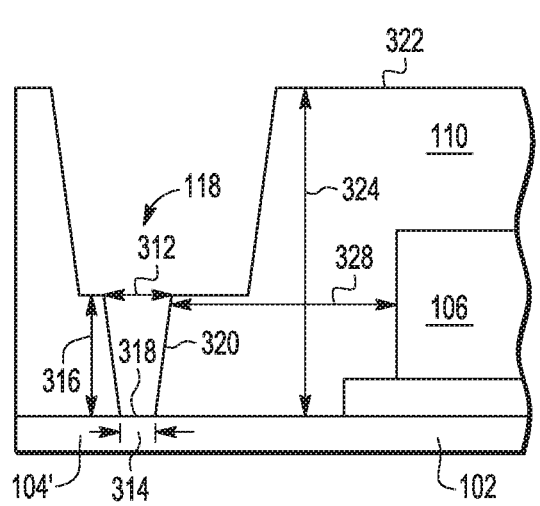
FIG. 3B  FIG. 3D

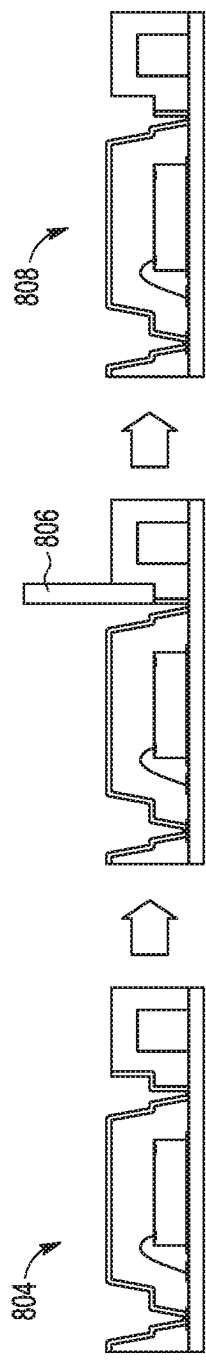
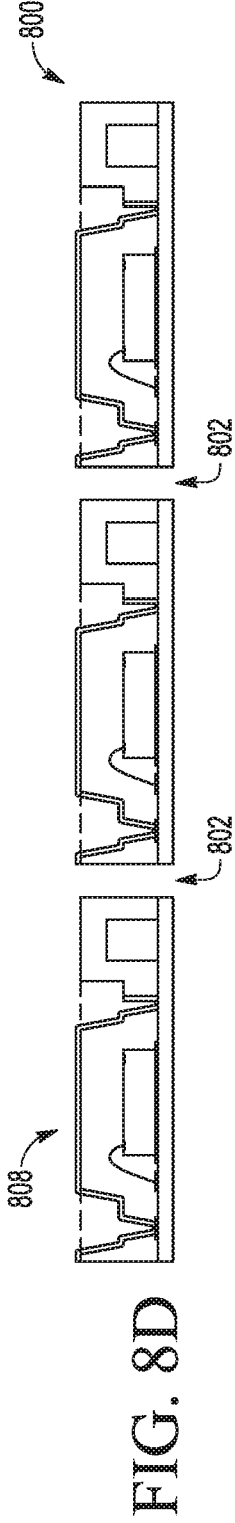
FIG. 8A  FIG. 8B  FIG. 8C
FIG. 8D
FIG. 9A  FIG. 9B  FIG. 9C
FIG. 9D

HIGH ASPECT RATIO CONNECTION FOR EMI SHIELDING

BACKGROUND

Field

This disclosure relates generally to microelectronic device packaging, and more specifically, to forming ground connections having high aspect ratios for shielding structures in packaged microelectronic devices.

Related Art

Electromagnetic interference (EMI) is disruptive electromagnetic energy generated by electromagnetic induction, electrostatic coupling, or conduction that affects the operation of electrical circuitry, such as circuits within a packaged microelectronic device. For example, radio frequency (RF) fields from natural or man-made sources may be radiating energy in the ambient environment. The radiation from the ambient environment may generate disruptive electromagnetic energy in an unshielded circuit within a packaged microelectronic device and may degrade performance of the circuit.

BRIEF DESCRIPTION OF THE DRAWINGS

The present invention may be better understood, and its numerous objects, features, and advantages made apparent to those skilled in the art by referencing the accompanying drawings.

FIGS. 2A, 2B, 2C, 2D, 2E, 3A, 3B, 3C, 3D, 4A, 4B, 4C, and 4D are block diagrams depicting various views of an example fabrication process to form a shielding structure connected to a ground contact area within a packaged semiconductor device through a tiered TMV connection having a high aspect ratio, according to some embodiments of the present disclosure.

FIGS. 8A, 8B, 8C, 8D, 9A, 9B, 9C, and 9D are block diagrams depicting various views of a finishing process to complete shielding structures on an array of packaged semiconductor devices and a singulation process to separate the individual packaged semiconductor devices, according to some embodiments of the present disclosure.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

OVERVIEW

A common problem experienced by packaged microelectronic devices is electromagnetic interference (EMI) from the ambient environment, which may degrade performance. A conventional solution may be to attach a metal lid to a packaged microelectronic device in order to shield the device from EMI. However, such metal lids may be bulky and take up valuable real estate on a PCB or substrate to which the device is attached. Another way to shield a device may be to form a metal layer over the packaged microelectronic device. However, the metal layer needs to be grounded, where such connections need to be formed through a thick package. For example, a conventional through mold via (TMV) having some desired footprint area may be formed using a drilling technique in a package with conventional thickness (e.g., packages with a thickness of 500 microns or less). However, the drilling technique is limited by the aspect ratio of the via. As the package becomes thicker (e.g., greater than 500 microns, such as 1000 microns), the aspect ratio of the via increases, meaning the drilling technique may not reach the desired footprint area before the via fills with slag from the drilling.

The present disclosure provides a tiered through mold via (TMV) having a high aspect ratio that is formed through a package body and exposes a ground contact area on the package substrate. A ground contact area may be an exposed surface on a ground lead finger, a grounded tie bar, or a ground substrate pad, depending on the type of substrate implemented. Conductive material is deposited on an outer surface of the package body and within the tiered TMV to form a shielding structure, which includes forming a continuous portion of the conductive material within the tiered TMV that makes electrical contact with the exposed ground contact area. Tiered TMV may include two or more recesses formed within the package body, where the upper recess generally has a wider sidewall profile than the lower recess, and also has a greater depth than the lower recess. The lower recess has a depth equal to or less than a maximum depth that can be drilled by a drilling or cutting technique without being blocked by slag. In some embodiments, multiple successive recesses may be formed to achieve the depth greater than half of the package thickness, where the number of recesses may depend on design constraints of the slope and width of each successive recess. Generally, fewer numbers of recesses are desired to simplify design and implementation, with at least two recesses forming the tiered TMV. Recesses may be circular shaped, trench shaped, slot shaped, or irregularly shaped as needed to clear features within the package body like wirebonds and electronic components.

Example Embodiments

Figure 1:
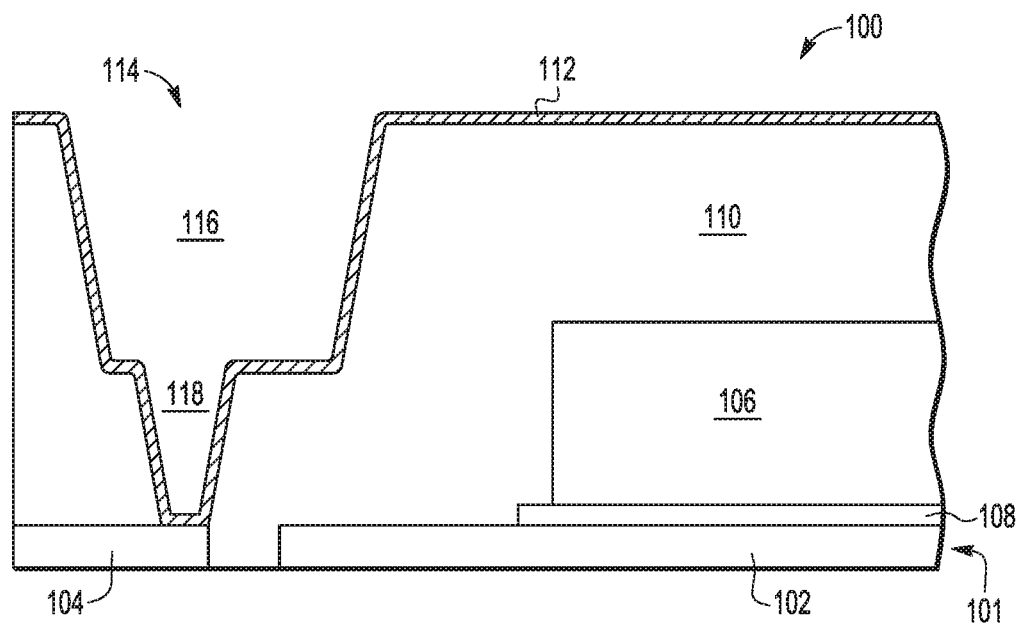
FIG. 1 is a block diagram depicting an example packaged semiconductor device having a shielding structure connected to a ground contact area within a packaged semiconductor device through a tiered TMV connection having a high aspect ratio, according to some embodiments of the present disclosure.

FIG. 1 shows an example packaged semiconductor device 100 having a shielding structure 112 that is grounded through a tiered through mold via (TMV) 114. Example steps for making such a device are shown in FIGS. 2A-2E, 3A-3D, and 4A-4D, with various examples of a tiered TMV shown in FIG. 5A-5H. Additional embodiments of a shielding structure for a packaged semiconductor device are also shown in FIGS. 6A-6B and 7A-7B, with additional example steps for forming such a device shown in FIGS. 8A-8C and FIGS. 9A-9C. Throughout the figures, an illustrated packaged semiconductor device may be representative of a single device or a plurality of devices formed as part of an array and then singulated into individual devices, as shown in FIGS. 8D and 9D.

Returning to FIG. 1, packaged semiconductor device 100 (also referred to as a package) includes a substrate 101 to which a semiconductor die 106 is attached with die attach material 108, and a mold body 110 (also referred to as a package body) surrounding the die 106 and over the substrate 101. The teachings provided herein are applicable to a substrate 101 with electrical connection contact surfaces, which includes a lead frame having a die paddle 102 and a number of lead fingers 104 as the electrical connection contact surfaces, as shown in FIG. 1, and also includes a laminate substrate 120 with a number of substrate pads 124 as the electrical connection contact surfaces, as shown in FIGS. 2E and 4D. Packaged semiconductor device 100 may also include wire bonds between one or more electronic components (such as die 106 or an antenna 606) and the electrical connection contact surfaces on the substrate 101, further discussed below.

A lead frame is a conductive frame that mechanically supports one or more electronic components, such as a semiconductor die, that may be attached to the die paddle of the lead frame (like semiconductor die 106 attached to die paddle 102, shown in FIG. 1), and provides external electrical connections for the components through the lead fingers of the lead frame (like lead fingers 104). A lead frame is formed from electrically conductive material, examples of which include but are not limited to copper, nickel, or other suitable conductive materials or alloy composed of one or more suitable conductive materials. The lead fingers (which are also electrical connection contact surfaces) may be coated with an electrically conductive material, examples of which include but are not limited to nickel, gold, copper, aluminum, tin, or other suitable conductive metal or alloy composed of one or more suitable conductive materials. The lead frame shown in FIG. 1 may be an individual lead frame, or may be a representative lead frame in a lead frame array that includes a plurality of lead frames.

A laminate substrate mechanically supports one or more electronic components, such as a semiconductor die, attached to a top surface of the laminate substrate that also includes a plurality of pads (like die 106 attached to the top surface of laminate substrate 120 that includes pads 124, shown in FIG. 2E). A laminate substrate is made of a number of dielectric material layers and conductive material layers to form conductive structures through the substrate, which include plating, pads (e.g., pads 124), interconnects, and vias. Such conductive structures are formed from an electrically conductive material, examples of which include but are not limited to nickel, gold, copper, aluminum, or other suitable conductive metal or alloy composed of one or more suitable conductive metals. The substrate pads (which are also electrical connection contact surfaces) may be coated with an electrically conductive material, examples of which include nickel, gold, copper, aluminum, tin, silver, titanium, or other suitable conductive metal or alloy composed of one or more suitable conductive metals in order to improve the "bondable" nature of the substrate pad. Examples of a laminate substrate include, but are not limited to, a ball grid array (BGA), a pin grid array (PGA), and the like. The laminate substrate shown in FIG. 2E may be an individual substrate, or may be a representative substrate in a substrate array that includes a plurality of laminate substrates.

Die 106 is a semiconductor die having a back side attached to the top surface of the substrate 101 (either to die paddle 102 or to laminate substrate 120) with die attach material 108, examples of which include but are not limited to polymer adhesives, epoxies, solders, pastes, films, tailored die cut tapes, and the like. The opposing front side of die 106 is in a face-up orientation and includes active circuitry and a number of die pads. In embodiments where the substrate is a lead frame, a number of wire bonds are formed between a die pad and a top surface of a respective lead finger 104 (like that shown in FIG. 2D). In embodiments where the substrate is a laminate substrate 120, a number of wire bonds are formed between a die pad and a respective substrate pad 124 (like that shown in FIG. 2E). The wire bonds electrically connect the die 106 to external connections on the substrate, which may be bottom surfaces of lead fingers 104 or solder balls on a bottom surface of laminate substrate 120 (not shown). Die 106 may be implemented on a semiconductor substrate, which can be any semiconductor material or combinations of materials, such as gallium arsenide, silicon germanium, silicon-on-insulator (SOI), silicon, monocrystalline silicon, the like, and combinations of the above.

Mold body 110 covers and protects the electrical components on the substrate 101, which may include die 106 and other components such as an antenna. In some embodiments, mold body 110 is made of an encapsulant material such as a mold compound based on a biphenyl type or multi-aromatic type epoxy resin, but may be other types of encapsulant materials in other embodiments. The mold body 110 may be formed by an encapsulating method, such as transfer molding, film assisted molding, glob top, dam and fill, underfill, lamination, or other types of other encapsulating methods.

Tiered TMV 114 is formed through mold body 110 at a lateral distance away from the electrical components on the substrate 101. Tiered TMV 114 may be formed through the entirety of mold body 110 by drilling or cutting two or more recesses into the mold body 110 at different depths. Drilling techniques include laser drilling that uses a laser source and mechanical drilling that uses a drill bit or water jet to remove portions of the mold body 110. Cutting techniques include using a mechanical saw blade to remove portions of the mold body 110. Different shapes of the drill bit or saw blade or different intensities of the laser source provides differently sloped sidewalls of the tiered TMV or a differently shaped tiered TMV 114. In the embodiments shown herein, recesses of a tiered TMV may be circular or cylindrical, which is beneficial due to simplicity of formation. In other embodiments, the recesses may be trench shaped, slot or oblong shaped, conical or truncated conical shaped, or irregularly shaped in order to maintain a minimum lateral distance between the sidewalls of the recesses forming the tiered TMV and neighboring electronic components, such as die 106, wirebonds 122, and antenna module 606 (further discussed below). In other embodiments, a tiered TMV be directly formed using film assisted molding (FAM) that uses a plunger member to form each recess of the tiered TMV. In other embodiments using FAM, a plunger member having the multiple recess shape of the completed tiered TMV may be positioned directly on the electrical connection contact surface to expose it without needing to drill or cut into the mold body 110. While two recesses are discussed herein, the tiered TMV may include multiple recesses.

Tiered TMV 114 exposes a portion of an electrical connection contact surface of the substrate 101 (which is lead finger 104 in FIG. 1, but may also be a substrate pad 124 like that shown in FIG. 4D), as further discussed below. The exposed potion of the electrical connection contact surface may also be referred to as an exposed contact area, where the size of the exposed contact area is large enough to ensure sufficient direct contact and bonding is made between a conductive material layer and the underlying electrical connection contact surface to form an electrical connection (discussed below), which may be up to and including the entirety of the electrical connection contact surface. Tiered TMV 114 includes at least a first (or upper) recess 116 and a second (or lower) recess 118, where the first recess 116 is formed having a greater depth (or height) than that of the second recess 118. At the plane where the first recess 116 ends and the second recess 118 begins, the first recess 116 has a greater diameter than the second recess 118, shown as a step in the tiered TMV 114. The sidewalls of the first recess 116 have a first slope and the sidewalls of the second recess 118 have a second slope, where the first and second slopes need not be equal. Each recess may also have multiple sidewalls, each sidewall having a different slope. The slopes of the recesses may each have a value that falls in a range of 0 degrees to 45 degrees, measured from the vertical (e.g., 0 degrees would be a vertical side wall), preferentially falling in a range of 0 to 20 degrees, inclusive, or preferentially falling in a range of 5 to 15 degrees, inclusive. The benefit provided by tiered TMV 114 to make connections having a high aspect ratio is further discussed below.

A layer of conductive material is formed over the mold body 110 that covers the electronic components (such as die 106) and over (and into) tiered TMV 114, forming a shielding structure 112. Shielding structure 112 is configured to shield and isolate the electronic components within the mold body 110 by blocking any electromagnetic interference (EMI) from the surrounding environment that may degrade performance of those components. The shielding structure 112 is formed from an electrically conductive material, examples of which include but are not limited to nickel, gold, copper, aluminum, silver, stainless steel, or other suitable conductive metal or alloy composed of one or more suitable conductive metals. For example, the shielding structure 112 may include a layer of stainless steel, a layer of copper, and another layer of stainless steel. The shielding structure 112 may be formed by conformally depositing the conductive material over the mold body 110, where the conductive material blocks RF radiation from passing through the shielding structure 112. Examples of depositing the conductive material include sputtering, spraying, inkjet, aerosol jet, and other suitable methods of conformally depositing the conductive material onto mold body 110. The effectiveness of the shielding structure 112 depends upon conductivity of the material used, the permeability of the material used, and the thickness of the material used.

As shown in FIG. 1, the conductive material is conformally deposited or formed over mold body 110 and into tiered TMV 114. The conductive material makes direct contact with and adheres to the mold body 110, including along the sidewalls of recesses 116 and 118 of tiered TMV 114, and down to the exposed contact area on lead finger 104, which is a ground-connected lead finger or grounded lead finger (or grounded substrate pad). The conductive material also makes direct contact with and bonds to the exposed contact area to form an electrical connection with the grounded lead finger (or substrate pad). The conductive material adhering to the sidewalls of tiered TMV 114 and directly contacting the grounded lead finger 104 may also be referred to as a ground connection for shielding structure 112. In other embodiments, portions of the mold body 110 may be selectively shielded or unshielded. For example, a portion of the mold body 110 that covers an antenna 606 may remain unshielded and is not sputtered with the conductive material, like that shown in FIGS. 6A-6B and 7A-7B, as further discussed below. In some embodiments, the tiered TMV may be filled with a conductive material or a non-conductive material after the shielding structure 112 is formed, which may be helpful for improving rigidity of the package body, especially if a trench shaped tiered TMV is implemented.

It is noted that the tiered TMV approach described herein is especially useful for making high aspect ratio vias for connections through thick packages (e.g., packages having a thickness of 700 microns or greater). For example, the ratio of the via height (e.g., the thickness of the mold body 110 from the top surface of the substrate 101 to the top surface of mold body 110) to the diameter of the bottom opening of the via (e.g., the diameter of the target contact area on a grounded lead finger or substrate pad to be exposed by the via) may be on the order of 5 to 1 or 10 to 1 or 15 to 1. Conventionally, a steeply sloped via (e.g., having a slope of less than 5 degrees) achieves a narrow sidewall profile (e.g., the via sidewalls are separated by a distance comparable to the diameter of the target contact area) that avoids the electronic components in a crowded package while exposing the target contact area. However, drilling techniques are limited by the aspect ratio of a via formed in a mold body. Drilling a single via with such a narrow sidewall profile in a package with a large thickness often results in slag (e.g., mold compound remnants from the drilling) filling the via and blocking the drilling before the target contact area can be reached, making single steeply sloped vias unsuitable for use in packaging processes that form packages with large thicknesses.

By contrast, the tiered TMV approach forms a first (or upper) recess 116 that generally has a wider sidewall profile (e.g., the sidewalls are separated by a distance much larger than the diameter of the target contact area). The upper recess 116 needs to overlap the target contact area, with the bulk of the wider sidewall profile capable of being laterally shifted away from the electronic components in the crowded package. The upper recess 116 is also drilled to a depth that leaves a remaining depth for the second (or lower) recess 118, which has a narrower sidewall profile than the upper recess 116 (e.g., the sidewalls are separated by a shorter distance as compared with the upper recess 116), ensuring that the shorter depth of the lower recess 118 will reach the target contact area without being blocked by slag. The remaining depth for the lower recess 118 is equal to or less than a maximum depth that the recess 118 can be drilled without being blocked by slag. In some embodiments, the upper recess 116 may be drilled to a depth greater than half of the package thickness, such as ⅔ or ¾ of the package thickness. In some embodiments, multiple successive recesses may be formed to achieve the depth greater than half of the package thickness, where the number of recesses may depend on design constraints of the slope and width of each successive recess. Generally, fewer numbers of recesses are desired to simplify design and implementation, with at least two recesses forming the tiered TMV.

In some embodiments, a recess (such as recesses 116 and 118) may be laterally constrained by electronic components in its vicinity, such as a nearby wirebond or an electronic component, where the sidewall profile of the recess is spaced apart from the electronic component to maintain a minimum lateral distance between the recess' sidewall and the electronic component or wirebond connection. Multiple successive recesses may be formed, where an uppermost recess in the mold body may have a widest sidewall profile in a region with fewest lateral constraints (e.g., few tall electronic components or wirebond connections may reach the region at the top of the package). A next upper recess within the mold body and under the uppermost recess has a next-widest sidewall profile based on lateral constraints of components in the region (e.g., the region near the middle of the package), and so on until the lowest recess that exposes the target contact area, which has the narrowest sidewall profile (e.g., the region near the bottom of the package is likely to be crowded even by short electronic components, which may laterally constrain the lowest recess to a minimum sidewall profile comparable to the diameter of the target contact area). While the lowest recess may have a narrow sidewall profile or may be steeply sloped (e.g., having a slope of less than 5 degrees) or both, the short depth of the lowest recess ensures that the target contact area can be exposed without being blocked by slag.

An additional problem with high aspect ratio vias often occurs during metal sputtering or similar deposition, which relies on line-of-sight that is also limited by the aspect ratio of the via. If a via has a too narrow sidewall profile with a too large depth comparable to the package thickness (e.g., a high aspect ratio on the order of 5:1, 10:1, or 15:1), an inadequate amount of metal reaches the sidewalls of the via due to the high aspect ratio of the via, forming a gap in metal coverage within the via. Without a continuous layer of metal along at least a portion of the via sidewalls reaching the target contact area on the grounded lead finger or substrate pad, the connection from the metal layer formed on the top of the package to the grounded lead finger or substrate pad is broken. By contrast, the tiered TMV approach ensures that each recess has a wide enough sidewall profile (e.g., large enough distance between sidewalls), that are sufficient to ensure conformal continuous metal coverage within the tiered TMV. While such an approach ensures conformal deposition even with vertical sidewalls (e.g., a slope of 0 degrees), the tiered TMV may further ensure conformal deposition by using sidewalls with a larger slope (e.g., greater than 0 degrees).

Figure 2A:
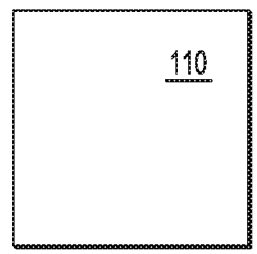
Figure 2B:
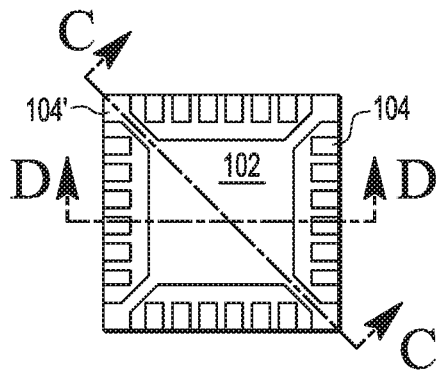

FIG. 2A shows a planar view of a top side of an encapsulated packaged semiconductor device 200 and FIG. 2B shows a planar view of a bottom side of device 200, after encapsulation has been completed but before a tiered TMV is formed. Device 200 is built on a substrate 101, which may be a lead frame or laminate substrate, like that described above. FIG. 2A shows a top surface of mold body 110, which covers the substrate 101 and any electronic components attached to the substrate 101, extending to the edges of the device 200.

Figure 2C:
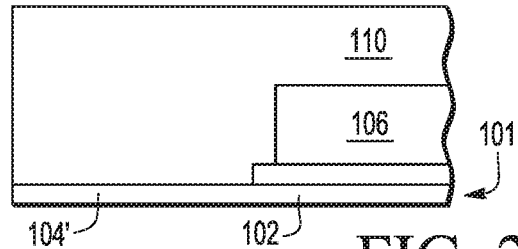
Figure 2D:
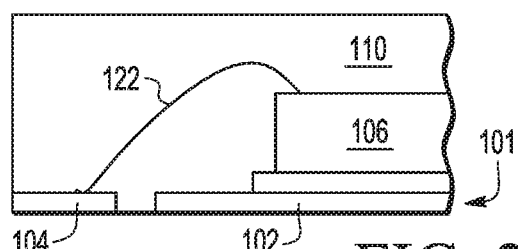
Figure 2E:
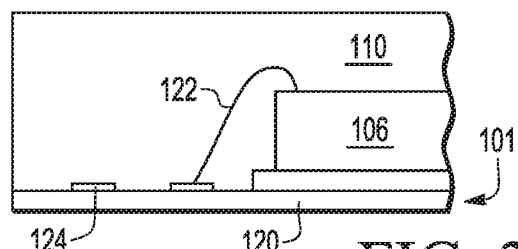

FIG. 2B-2D show views of an embodiment of device 200 built on a lead frame having a die paddle 102 and a plurality of lead fingers 104 that extend away from the die paddle 102. A lead frame may also have one or more lead fingers connected to the die paddle 102 by tie bars, where the combination of a lead finger and a tie bar are referred to as lead finger 104'. Lead fingers 104' are located in the corners of the lead frame in the embodiment shown in the planar view of FIG. 2B and in the cross-sectional view of FIG. 2C, which is made diagonally through device 200. However, lead fingers 104' may be located elsewhere around the die paddle 102 in other embodiments of the lead frame. Lead fingers 104' may serve as desired ground connections to which a shielding structure 112 may make contact through a tiered TMV 114, where the tiered TMV 114 may expose a surface of the lead finger portion or the tie bar portion of lead finger 104'. FIG. 2D shows another lead finger 104 separate from die paddle 102 (e.g., without a tie bar), where a wirebond 122 is formed between a pad on the die 106 to lead finger 104 to form electrical connections for the die. One or more lead fingers 104 without tie bars (and without wirebonds 122) may also serve as desired ground connections for a tiered TMV 114 (like that shown in FIG. 4D, discussed below). In FIG. 2E, an embodiment of device 200 is built on a laminate substrate 120, where a grounded substrate pad 124 may serve as a desired ground connection to which a shielding structure 112 may make contact through a tiered TMV 114. Other substrate pads 124 are also provided to form connections for the die, such as wirebond 122 formed between a pad on the die 106 and a neighboring substrate pad 124.

FIG. 3A shows a planar view of a top side of device 200 and FIG. 3B shows a cross-sectional view of device 200 after a first recess 116 of a tiered TMV is formed. In the embodiment shown, a drilling technique or other suitable cutting technique is used to remove a portion of the mold body 110, formed into the top surface 322 of mold body 110 down to a depth 306. Depth 306 is greater than half of the thickness 324 of the mold body 110 (shown in FIG. 3D), measured from the top surface 322 of the mold body 110 down to the top surface of substrate 101. Forming the first recess 116 into the mold body 110 down to depth 306 leaves a remaining depth 316 for the second recess 118 (shown in FIG. 3D), where the remaining depth 316 is equal to or less than a maximum depth that the drilling or cutting technique can successfully form a via with a narrow sidewall profile without being blocked by slag. The first recess 116 has a bottom surface 308 and sidewalls 310 within mold body 110. In the embodiment shown, sidewalls 310 have a same positive slope, shown as sidewalls 310 being spaced apart by a larger diameter 302 at a top opening of the recess 116 and a smaller diameter 304 at a bottom opening of the recess 116. In other embodiments, sidewalls 310 may be vertical (e.g., having a slope of 0 degrees, with equal diameters 302 and 304) or each sidewall 310 may have different slopes (as shown in FIG. 5A-5H). A minimum lateral distance 326 is also shown between an electronic component (such as die 106) and a closest sidewall 310 to that component. Placement of the tiered TMV is constrained based on achieving the minimum lateral distance 326 between the sidewalls 310 (or any portion thereof) of the first recess 116 and any surrounding electronic components.

FIG. 3C shows a planar view of a top side of device 200 and FIG. 3D shows a cross-sectional view of device 200 after a second recess 116 of a tiered TMV is formed. In the embodiment shown, the drilling or cutting technique is used to remove another portion of the mold body 110 through the remaining depth 316. The second recess 116 is formed into the bottom surface 308 of the first recess 116 and exposes a portion of a grounded electrical connection contact surface (such as a grounded lead finger 104 or 104' or a grounded substrate pad 124) of the substrate 101, also referred to as a ground contact area 318. The second recess has sidewalls 320 within mold body 110. In the embodiment shown, sidewalls 320 have a same positive slope, shown as sidewalls 320 being spaced apart by a larger diameter 312 at a top opening of the recess 118 and a smaller diameter 314 at a bottom opening of the recess 118. In other embodiments, sidewalls 320 may be vertical (e.g., having a slope of 0 degrees, with equal diameters 312 and 314) or each sidewall 320 may have different slopes (as shown in FIG. 5A-5H). A minimum lateral distance 328 is also shown between an electronic component (such as die 106) and a closest sidewall 320 to that component. Placement of the tiered TMV is constrained based on achieving the minimum lateral distance 328 between the sidewalls 320 (or any portion thereof) of the second recess 118 and any surrounding electronic components.

The resulting tiered TMV shown in FIGS. 3C and 3D may also be achieved by a film assisted molding process using a plunger member having the desired shape of the tiered TMV positioned directly on and over the ground contact area 318. The region surrounding the plunger member is encapsulated with mold compound to form mold body 110, resulting in the tiered TMV formed at one time, exposing the contact area 318 without needing to drill or cut into the mold body 110.

Regardless of how the tiered TMV is formed, the first or upper recess 116 may be described as having a wider sidewall profile than the second or lower recess 118, which can be seen at the plane formed where upper recess 116 ends and lower recess 118 begins. A step or tier can be seen at this plane in FIG. 3D, which is formed by the bottom opening of recess 116 and the top opening of recess 118. The sidewalls 310 of upper recess 116 are generally separated from each other by at least diameter 304 (where diameter 302 may be equal to or greater than diameter 304), which is greater than diameter 312 that separates the sidewalls 320 of lower recess 118 (where diameter 312 may be comparable to diameter 314 of the contact area). In some embodiments, diameter 304 may be two or more times greater than diameter 312.

It is also noted that the resulting tiered TMV achieves a high aspect ratio of the overall height 324 of the tiered TMV (which is equal to the thickness 324 of the mold body 110 through which the tiered TMV is formed) to the diameter 314 of the bottom opening of the tiered TMV that exposes ground contact area 318.

Generally, depth 316 of lower recess 118 may be varied up to a maximum value of depth 316, which in some embodiments depends on the size of bottom diameter 314 and a maximum aspect ratio achievable by the drilling or cutting technique used to form lower recess 118 having a narrow sidewall profile. In some embodiments, the maximum aspect ratio is less than 4:1 for forming a lower recess 118 having a narrow sidewall profile without being blocked by slag. As a first example, if the contact area 318 desired to be exposed has a bottom diameter 314 of 125 microns, then the maximum value of depth 316 would be approximately 475 microns, assuming an aspect ratio of 3.8:1. For a positive slope of 15 degrees for sidewalls 320, the resulting top diameter 312 for lower recess 118 having the maximum depth 316 would be approximately 380 microns. If a smaller bottom diameter 314 is desired, the depth 316 must also be reduced. As a second example, reducing the bottom diameter 314 to 50 microns would require a maximum value of depth 316 to be approximately 190 microns. Lower recess 118 having sidewalls 320 with positive slope of 15 degrees and maximum depth 316 in this example would result in top diameter 312 being approximately 152 microns.

Although the examples discussed above implement a positive slope of 15 degrees in sidewalls 320, the sidewalls 320 may be implemented with other slopes, including those less than 15 degrees. In some embodiments, bottom diameter 314, bottom diameter 312, or both may be increased (e.g., to widen the sidewall profile) to ensure adequate metal coverage on sidewalls 320 within lower recess 118. Different examples of slopes implemented in sidewalls 320 (and sidewalls 310) are shown in FIG. 5A-5H, discussed below.

As depth 316 of the lower recess 118 changes, depth 306 of the upper recess 116 also changes. In some embodiments, depth 306 is achieved using one or more upper recesses, depending on the overall thickness 324 of the mold body 110 and a maximum aspect ratio achievable by the drilling or cutting technique used to form upper recess 116 having a wide sidewall profile. In some embodiments, the maximum aspect ratio is less than 2:1 for forming an upper recess 116 having a wide sidewall profile. As noted above, the bottom diameter 304 of the upper recess 116 may also be at least twice as large as the top diameter 312 of the lower recess 118. Continuing the first example from above that has a lower recess 118 having a depth 316 of 475 microns in a package having a thickness 324 of 1250 microns, depth 306 would be approximately 775 microns, resulting in a diameter 304 of approximately 517 microns, assuming an aspect ratio of 1.5:1. Continuing the second example from above that has a lower recess 118 having a depth 316 of 190 microns in a package also having a thickness 324 of 1250 microns, depth 306 would be approximately 1060 microns, resulting in a diameter 304 of approximately 605 microns, assuming an aspect ratio of 1.75:1. Further, if the same lower recess 118 were implemented in a thinner package, the upper recess 116 may not need to be as wide since depth 306 is shorter. For example, a lower recess 118 having a depth 316 of 190 microns in a package having a thickness 324 of 750 microns, depth 306 would be approximately 560 microns, resulting in a diameter 304 of approximately 320 microns, assuming an aspect ratio of 1.75:1.

Figure 4A:
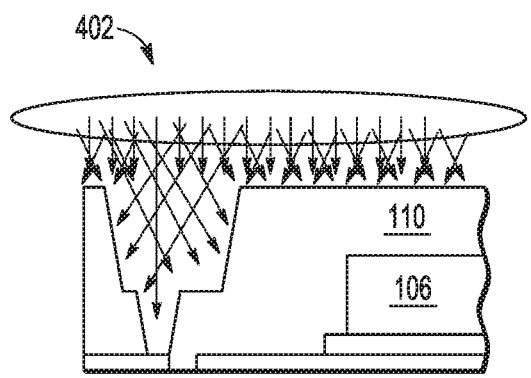
Figure 4B:
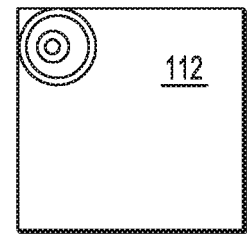
Figure 4C:
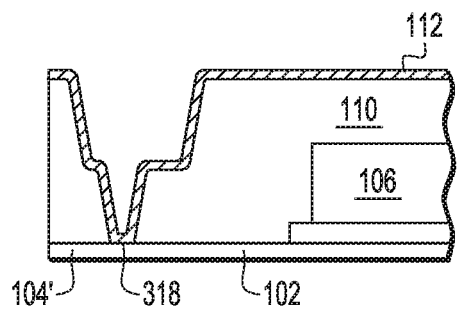
Figure 4D:
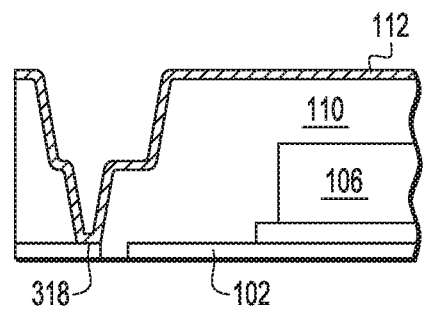
Figure 4E:
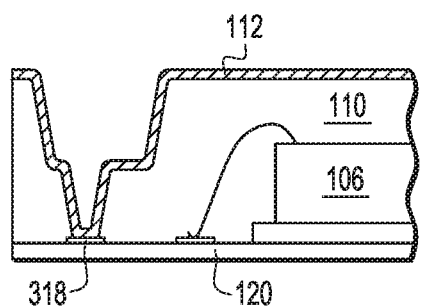

FIG. 4A shows a cross-sectional view of device 200 during a sputtering step after the tiered TMV is formed. A sputtering source 402 or other suitable deposition source deposits a conformal layer of conductive material over device 200, including over the top surface 322 of mold body 110 and into tiered TMV 114. FIG. 4B shows a planar view of a top side of the resulting device 200 after shielding structure 112 is formed from the layer of conductive material over device 200, which directly contacts the top surface 322 of mold body 110. Different embodiments of the device 200 are shown in FIG. 4C-4E, which include tiered TMV formed over different ground contact areas 318. FIG. 4C shows a cross-sectional view of a device 200 formed on a lead frame, where the tiered TMV exposes ground contact area 318 on a lead finger 104' that includes a tie bar connected to die paddle 102, which may be an exposed surface on the lead finger portion or on the tie bar portion or on both (e.g., surface 318 may span a portion of both the lead finger and the tie bar surfaces). FIG. 4D shows a cross-sectional view of a device 200 formed on a lead frame, where the tiered TMV exposes ground contact area 318 on a lead finger 104 that is not connected to the die paddle 102. FIG. 4E shows a cross-sectional view of a device 200 formed on a laminate substrate 120, where the tiered TMV exposes ground contact area 318 on substrate pad 124. In each of FIGS. 4C, 4D, and 4E, the conformal layer of conductive material that forms shielding structure 112 directly contacts the top surface 322 of mold body 110, directly contacts at least a portion of the sidewalls of tiered TMV 114, and directly contacts the exposed ground contact area 318 in such a way to form a continuous portion of the conductive material within the tiered TMV. This continuous portion of conductive material forms a ground connection for the shielding structure 112 that makes electrical contact with the exposed ground contact area 318 of a ground lead finger, grounded tie bar, or ground substrate pad.

FIGS. 5A, 5B, 5C, 5D, 5E, 5F, 5G, and 5H show different embodiments of a tiered TMV, where the sidewalls 310 of upper recess 116 each have a slope, respectively implemented by angles Phi1 ($\varphi 1$) and Phi2 ($\varphi 2$). The sidewalls 320 of lower recess 118 also each have a slope, respectively implemented by angles Theta1 ($\theta 1$) and Theta2 ($\theta 2$). The angles $\varphi 1$ and $\varphi 2$ are measured from a vertical plane aligned with bottom diameter 304 of upper recess 116, and angles $\theta 1$ and $\theta 2$ are measured from a vertical plane aligned with the bottom diameter 314 of lower recess 118. In all embodiments discussed herein, the slope of a sidewall may be either 0 degrees or may be a positive slope implemented by a positive angle value, where a sidewall with a positive slope leans or slopes outward from a recess (as contrasted with a negative slope, which would form an undercut to which no metal would attach). In all embodiments discussed herein, the bottom diameter 304 of the upper recess 116 is larger than the top diameter 312 of the lower recess 118, and the bottom diameter 314 of the lower recess 118 is smaller than or equal to the top diameter 312 of the lower recess 118.

Figure 5D:
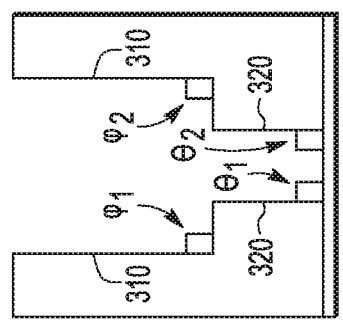
FIGS. 5A, 5B, 5C, 5D, 5E, 5F, 5G, and 5H are block diagrams depicting various example angles used to implemented a tiered TMV, according to some embodiments of the present disclosure.
Figure 5C:
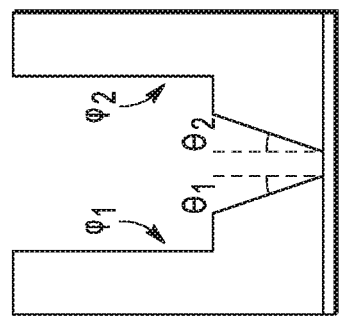
Figure 5B:
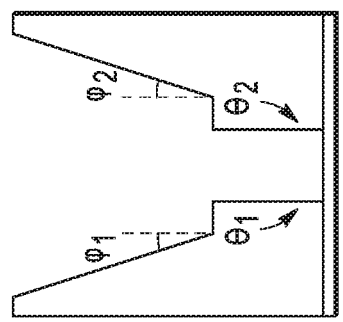
Figure 5A:
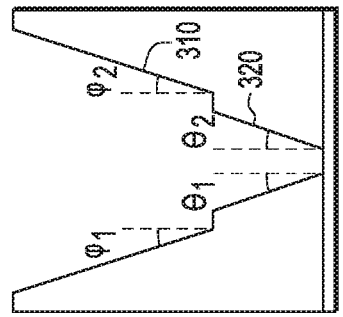

Each of angles $\varphi 1$, $\varphi 2$, $\theta 1$, and $\theta 2$ has a value that falls in a range of 0 to 20 degrees, inclusive. For example, FIG. 5A shows an embodiment where each of angles $\varphi 1$, $\varphi 2$, $\theta 1$, and $\theta 2$ is 0 degrees, meaning the sidewalls 310 and 320 are vertical, as indicated by the right angle marking, while FIG. 5D may show an embodiment where each of angles $\varphi 1$, $\varphi 2$, $\theta 1$, and $\theta 2$ is a same angle value greater than 0 degrees, meaning the sidewalls 310 and 320 have a same slope. However, the angles $\varphi 1$, $\varphi 2$, $\theta 1$, and $\theta 2$ need not be the same angle value. In some embodiments, angles $\varphi 1$ and $\varphi 2$ may have a first angle value and angles $\theta 1$ and $\theta 2$ may have a second angle value. For example, FIG. 5B shows an embodiment where angles $\theta 1$ and $\theta 2$ have a same angle value greater than 0 degrees, forming sidewalls 320 with a same positive slope, while angles $\varphi 1$ and $\varphi 2$ are both 0 degrees. FIG. 5C shows an embodiment where angles $\varphi 1$ and $\varphi 2$ have a same angle value greater than 0 degrees, forming sidewalls 310 with a same positive slope, while angles $\theta 1$ and $\theta 2$ are both 0 degrees.

Figure 5H:
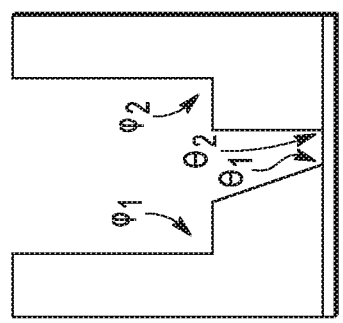
Figure 5G:
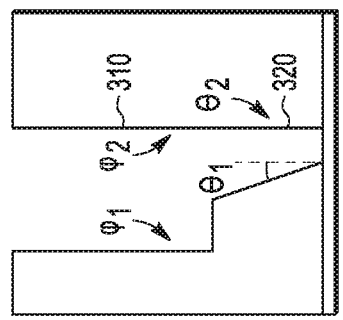
Figure 5F:
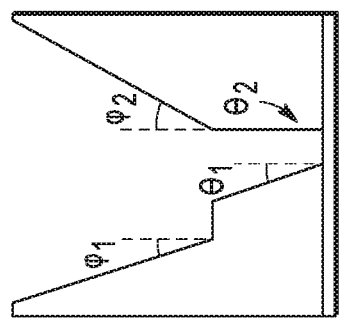
Figure 5E:
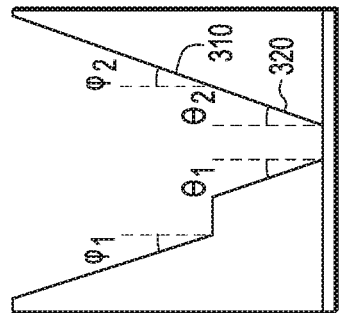

Further, angles $\varphi 1$ and $\varphi 2$ need not be the same angle value, and angles $\theta 1$ and $\theta 2$ need not be the same angle value. For example, FIG. 5D may also show an embodiment where each of angles $\varphi 1$, $\varphi 2$, $\theta 1$, and $\theta 2$ have a different angle value, implementing a different slope in each sidewall 310 and 320. FIG. 5E shows an embodiment where angles $\theta 1$ and $\theta 2$ have different angle values, such as where $\theta 1$ has an angle value greater than 0 degrees while $\theta 2$ is 0 degrees, which is also implemented in the lower recess of FIG. 5F and FIG. 5G. FIG. 5G further shows an embodiment where angles $\varphi 1$ and $\varphi 2$ of the upper recess have different angle values, such as where $\varphi 1$ has a first angle value greater than 0 degrees, and $\varphi 2$ has a second angle value greater than the first angle value.

The bottom diameter of the upper recess may also be varied, as long as the bottom diameter remains larger than the top diameter of the lower recess. For example, FIG. 5E shows the bottom diameter of the upper recess as approximately three times larger than the top diameter of the lower recess. FIG. 5F-5H show a smaller bottom diameter of the upper recess, which is approximately twice as large as the top diameter of the lower recess. The bottom diameter of the upper recess also need not be centered over the bottom diameter of the lower recess (like that shown in FIG. 5A-5D), but may be shifted to one side, which is helpful for avoiding electronic components laterally adjacent to the tiered TMV. In such embodiments, the bottom diameter 304 of the upper recess 116 must still overlap the entirety of top diameter 312 of the lower recess 118, or else an unacceptable overhang may be formed. For example, FIG. 5F-5H show upper recess 116 shifted, at least partially, to the left, where at least a right side of bottom diameter 304 of the upper recess 116 is aligned with a right side of top diameter 312 of the lower recess 118. FIG. 5F shows the right sidewall 310 of the upper recess 116 aligned with the right sidewall 320 of the lower recess 118, due to both sidewalls having 0 degree slope. FIG. 5G shows a bottom end of sidewall 310 (formed by the bottom diameter 304) aligned with a top end of sidewall 320 (formed by the top diameter 312). Since sidewalls 310 and 320 have different slopes, sidewall 310 slopes outward and away from sidewall 320. FIG. 5H similarly shows a bottom end of sidewall 310 also aligned with a top end of sidewall 320. Since sidewalls 310 and 320 have a same slope, both sidewalls 310 and 320 form a uniform sidewall of the tiered TMV.

Figure 6A:
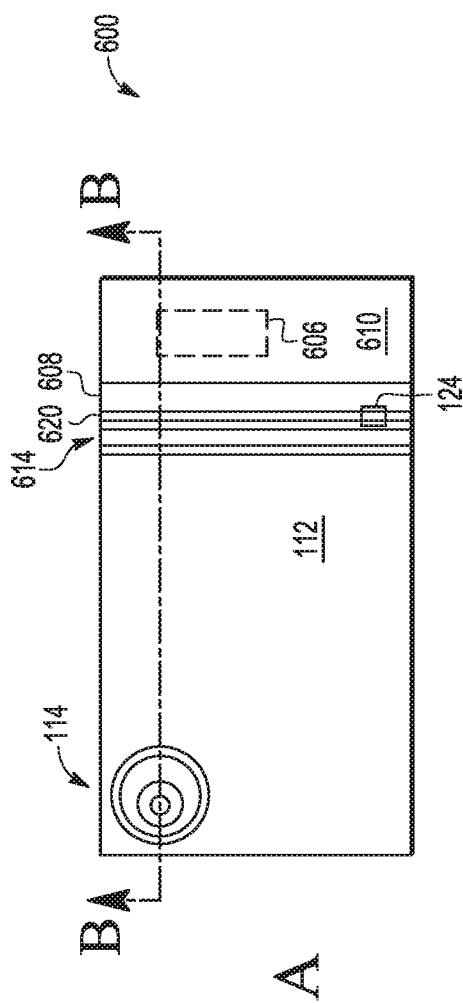
FIGS. 6A, 6B, 7A, and 7B are block diagrams depicting various views of example packaged semiconductor devices that include a shielding structure connected to a ground contact area through a tiered TMV connection, according to some embodiments of the present disclosure.
Figure 6B:
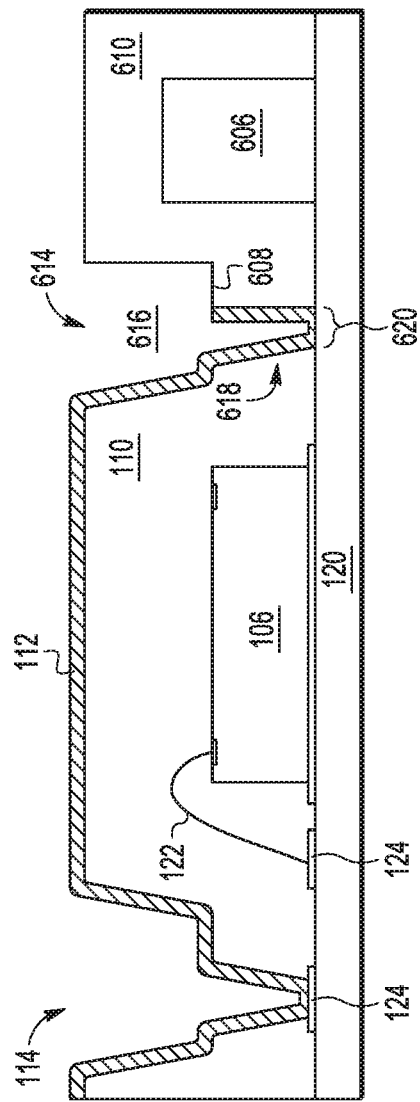

FIG. 6A shows a planar view of a top side of a packaged semiconductor device 600 and FIG. 6B shows a cross-sectional view of the device 600, where device 600 is implemented on a laminate substrate 120 to which a die 106 and an antenna module 606 are attached. Antenna module 606 may include at least one antenna for wireless communication, such as radio frequency (RF) communication. For example, antenna module 606 may include a dedicated transmitting antenna and a dedicated receiving antenna in some embodiments, while in other embodiments, antenna module 606 may include a single antenna configured to function as both the transmitting antenna and the receiving antenna (e.g., a circulator or other coupling device would also be needed to connect transmitter output to the antenna during a transmission phase and to connect the antenna to receiver input during a receive phase). In some embodiments, antenna module 606 is a chip antenna, which is a passive surface mount device (SMD) having an antenna included in a ceramic body that has high permittivity and low loss. In some embodiments, a chip antenna may include a quarter-wave element and uses a ground plane in an underlying PCB as a counterpoise to form a half-wave dipole, not shown. Examples of the at least one antenna of antenna module 606 include but are not limited to a patch antenna, a microstrip antenna, a helical antenna, a loop antenna, a monopole antenna, and the like.

Antenna module 606 includes at least one pin connected to a substrate pad 124, which in turn is connected to die 106 through electrical connections in the laminate substrate 120. In embodiments implementing antenna module 606, die 106 includes a radio frequency (RF) front end, or RF transmitter and receiver respectively configured to transmit and receive RF signals. The RF front end component may be implemented as an integrated circuit (IC) or IC die that includes front end components of the RF transmitter and receiver (e.g., a transmitter power amplifier, a receiver low noise amplifier, one or more baluns, one or more filters, a circulator or other coupling device, impedance matching elements, and other appropriate front end elements). Die 106 also includes functionality for processing the transmitted and received RF signals (e.g., includes circuitry that implements digital signal processing).

One or more substrate pads 124 may also be designated for use in grounding a shielding structure 112, an example of which is shown in FIG. 6A near the bottom right corner of the device 600. In the embodiment shown, a first tiered TMV 114 is located in the top left corner of the device 600, which makes a first ground connection to a first substrate pad 124 and maintains a minimum lateral distance away from a neighboring wirebond 122 (shown in FIG. 6B), as similarly discussed above. A second tiered TMV 614 is formed as a trench across device 600 near the right side of the device 600, which makes contact with the substrate pad 124 in the bottom right corner of FIG. 6A. An upper recess 616 of tiered TMV 614 may be formed by a drilling or cutting technique, including using a mechanical saw blade to form recess 616 as a trench having a bottom surface 608 extending across a top region of mold body 110 between die 106 and antenna module 606. A lower recess 618 may then be formed by a drilling or cutting technique, including using a thinner mechanical saw blade (compared to the saw blade to form recess 616) or laser drilling to form another trench having a bottom surface that exposes a surface 620 of a portion of the substrate 120, extending across the device 600 between die 106 and antenna module 606. As a result of forming the trench-shaped tiered TMV 614 in mold body 110, a mold body portion 610 is separated from the main mold body portion 110, where mold body portion 610 continues to cover and protect the antenna module 606.

A layer of conductive material is also deposited over the device 600, including into tiered TMVs 114 and 614, to form shielding structure 112. Since mold body portion 610 covers an antenna, a covering or frame may be used to block the deposition of conductive material over mold body portion 610, while allowing deposition of conductive material into the second tiered TMV 614 that reaches the underlying substrate pad 124 and along the exposed surface 620 of the substrate 120. The layer of conductive material deposited within tiered TMV 614 effectively extends the shielding structure 112 between die 106 and antenna module 606 to block (or at least reduce) electromagnetic interference (EMI) between die 106 and antenna module 606, as well as block (or at least reduce) any external EMI from the ambient environment.

FIG. 8A-8D show example steps for forming device 600. As shown in FIG. 8A, the conductive material may be blocked from being deposited over mold body portion 610, but some conductive material may still be deposited along the sidewalls of the tiered TMV 614, including the sidewalls of the upper recess 616, resulting in device 804. However, depending on the shape of the tiered TMV 614 and the lateral distance between the antenna module 606 and tiered TMV 614, it may be beneficial to remove the conductive material from the side of tiered TMV 614 closest to the antenna module 606 to ensure proper performance of the antenna module 606. FIG. 8B shows a saw blade 806 being used to remove the excess conductive material from the sidewall of upper recess 616, which results in the device 808 shown in FIG. 8C, similar to that shown in FIG. 6B. Saw blade 806 may have a blunted end in order to remove the excess conductive material. As an optional step, the tiered TMV 614 (and 114) may be filled with a conductive material (e.g., stainless steel) or a non-conductive material (e.g., additional mold compound) after the shielding structure 112 is formed, which is shown as a dashed line over the tiered TMVs in the devices shown in FIG. 8D. The filling step is helpful for improving rigidity of the package body 110, especially since the trench shaped tiered TMV 614 may be large enough in some embodiments to form a weakened area in the package. FIG. 8D shows a panel 800, which is an array of laminate substrates 120 on which a plurality of devices 808 are built, as discussed above. While devices 808 appear to resemble device 600, devices 808 are representative of any embodiment of a packaged semiconductor device built on a laminate substrate and includes one or more tiered TMVs as discussed herein. Panel 800 is singulated using a singulation technique 802 that separates panel 800 into individual devices 808.

Figure 7A:
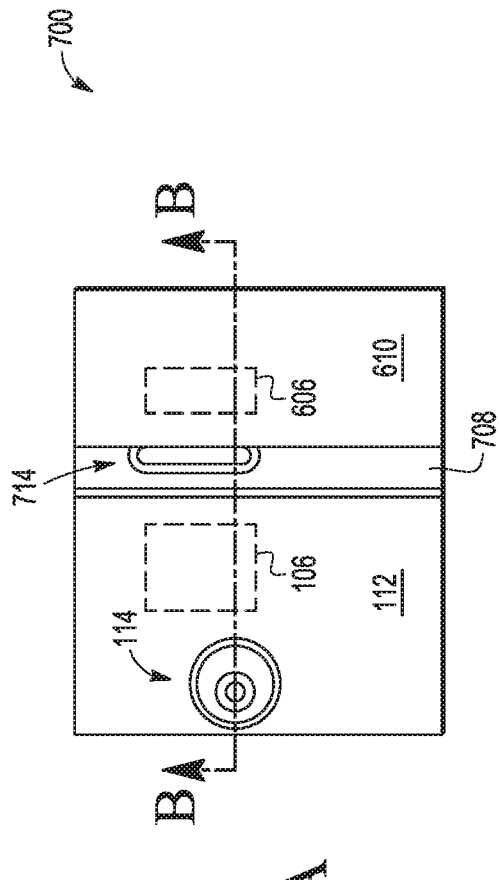
Figure 7B:
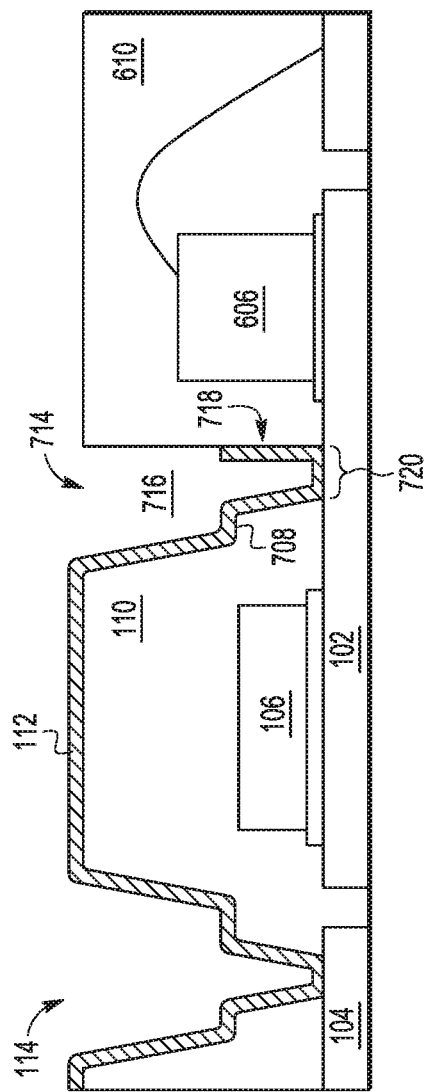

FIG. 7A shows a planar view of a top side of a packaged semiconductor device 700 and FIG. 7B shows a cross-sectional view of the device 700, where device 700 is implemented on a lead frame including a die paddle 102 to which a die 106 and an antenna module 606 are attached, and a plurality of lead fingers 104, which may also include lead fingers 104'. Antenna module 606 includes at least one pin connected to a lead finger 104 by wirebond 122, which may serve as an external connection or may be a lead finger that is also connected to die 106 through another wirebond 122, where lead finger 104 is separated from die paddle 102.

One or more lead fingers 104 may also be designated for use in grounding a shielding structure 112, an example of which is shown in FIG. 7B near the left side of the device 700. In the embodiment shown, a first tiered TMV 114 is located on the left side of the device 700, which makes a first ground connection to a lead finger 104 (which may also be a lead finger 104') and maintains a minimum lateral distance away from any neighboring electrical components like die 106 (shown in FIG. 7B), as similarly discussed above. A second tiered TMV 714 is formed as a trench across device 700 near the middle of the device 700, which makes electrical contact with the die paddle 102 in the middle of FIG. 7B. An upper recess 716 of tiered TMV 714 may be formed by a drilling or cutting technique, including using a mechanical saw blade to form recess 716 as a trench having a bottom surface 708 extending across a top region of mold body 110 between die 106 and antenna module 606. A lower recess 718 may then be formed by a drilling or cutting technique, including using a thinner mechanical saw blade (compared to the saw blade to form recess 716) or laser drilling to form a shorter trench within trench 716. The shorter trench has a bottom surface that exposes a surface 720 of a portion of the die paddle 102, extending across a portion of the device 700 between die 106 and antenna module 606.

A layer of conductive material is also deposited over the device 700, including into tiered TMVs 114 and 714, to form shielding structure 112. Since mold body portion 610 covers an antenna, a covering or frame may be used to block the deposition of conductive material over mold body portion 610, while allowing deposition of conductive material into the second tiered TMV 714 along the exposed surface 720 of underlying die paddle 102. The layer of conductive material deposited within the lower recess 718 of tiered TMV 714 effectively extends the shielding structure 112 between die 106 and antenna module 606 to block (or at least reduce) electromagnetic interference (EMI) between die 106 and antenna module 606, as well as block (or at least reduce) any external EMI from the ambient environment.

FIG. 9A-9D show example steps for forming device 700. As shown in FIG. 9A, the conductive material may be blocked from being deposited over mold body portion 610, but some conductive material may still be deposited along the sidewalls of the tiered TMV 714, including the sidewalls of the upper recess 716, resulting in device 904. However, depending on the shape of the tiered TMV 714 and the lateral distance between the antenna module 606 and tiered TMV 714, it may be beneficial to remove the conductive material from the side of tiered TMV 714 closest to the antenna module 606 to ensure proper performance of the antenna module 606. FIG. 9B shows a saw blade 806 being used to remove the excess conductive material from the sidewall of upper recess 716, at least in the vicinity of antenna module 606, which results in the device 908 shown in FIG. 9C, similar to that shown in FIG. 7B. Saw blade 806 may have a blunted end in order to remove the excess conductive material. As an optional step, the tiered TMV 716 (and 114) may be filled with a conductive material (e.g., stainless steel) or a non-conductive material (e.g., additional mold compound) after the shielding structure 112 is formed, which is shown as a dashed line over the tiered TMVs in the devices shown in FIG. 9D. FIG. 9D shows an array 900 of lead frames on which a plurality of devices 908 are built, as discussed above. While devices 908 appear to resemble device 700, devices 908 are representative of any embodiment of a packaged semiconductor device built on a lead frame and includes one or more tiered TMVs as discussed herein. Array 900 is singulated using a singulation technique 802 that separates array 900 into individual devices 908. The singulation technique 802 for a lead frame array may include a trim and form process to separate each lead frame from any surrounding support structures.

The active circuitry described herein (such as RF front end circuitry or signal processing circuitry of die 106) can be implemented on a semiconductor wafer, which may include any semiconductor material or combinations of materials, such as gallium arsenide, silicon germanium, silicon-on-insulator (SOI), silicon, monocrystalline silicon, the like, and combinations of the above. The active circuitry for die 106 is formed using a sequence of numerous process steps applied to a semiconductor wafer, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. Examples of integrated circuit components include but are not limited to a processor, memory, logic, analog circuitry, sensor, MEMS (microelectromechanical systems) device, a standalone discrete device such as a resistor, inductor, capacitor, diode, power transistor, and the like. In some embodiments, the active circuitry may be a combination of the integrated circuit components listed above or may be another type of microelectronic device.

By now it should be appreciated that there has been provided a tiered through mold via (TMV) having a high aspect ratio that is formed through a package body and exposes a ground contact area on the package substrate. Conductive material is deposited on an outer surface of the package body and within the tiered TMV to form a shielding structure, which includes forming a continuous portion of the conductive material within the tiered TMV that makes electrical contact with the exposed ground contact area. Tiered TMV may include two or more recesses formed within the package body, where the upper recess generally has a wider sidewall profile than the lower recess, and also has a greater depth than the lower recess.

In one embodiment of the present disclosure, a packaged semiconductor device is provided, which includes: a substrate; a semiconductor die attached to a top surface of the substrate; a mold body formed over the substrate and surrounding the semiconductor die; a tiered through mold via (TMV) including: a first recess formed in the mold body, having a recessed surface within the mold body at a first depth, and a second recess formed in the mold body from the recessed surface to a second depth that exposes a ground contact area on a bonding area on the top surface of the substrate, wherein the first depth is greater than the second depth; and a metal shielding layer formed on a top surface of the mold body to form a shielded mold body, wherein the metal shielding layer makes direct contact with at least one sidewall of the first recess, with at least a portion of the recessed surface, with at least one sidewall of the second recess, and with the ground contact area.

One aspect of the above embodiment provides that a top opening diameter of the second recess is less than a diameter of the recessed surface.

Another aspect of the above embodiment provides that a combined depth of the first and second depths is at least 5 times larger than a bottom opening diameter of the second recess.

Another aspect of the above embodiment provides that the second depth of the second recess is less than 500 microns.

Another aspect of the above embodiment provides that a portion of a first sidewall of the first recess is aligned with a portion of a second sidewall of the second recess.

Another aspect of the above embodiment provides that the first recess has at least one sidewall having a positive slope in a range of 0 to 20 degrees measured from a vertical plane.

Another aspect of the above embodiment provides that the second recess has at least one sidewall having a positive slope in a range of 0 to 20 degrees measured from a vertical plane.

Another aspect of the above embodiment provides that the first recess includes one of a cylindrical shape, an oblong shape, a truncated conical shape, and a trench shape.

Another aspect of the above embodiment provides that the second recess includes one of a cylindrical shape, an oblong shape, a truncated conical shape, and a trench shape.

Another aspect of the above embodiment provides that the packaged semiconductor device further includes: an antenna attached to the top surface of the substrate; and a second mold body formed over and surrounding the antenna, wherein the second mold body is not covered by the metal shielding layer.

A further aspect of the above embodiment provides that the second mold body is laterally separated from the shielded mold body by at least one trench recess.

Another further aspect of the above embodiment provides that at least one tiered TMV is formed between the antenna and the semiconductor die.

Another aspect of the above embodiment provides that the substrate includes a lead frame, and the semiconductor die is attached to a top surface of a die paddle of the lead frame.

A further aspect of the above embodiment provides that the second recess exposes the ground contact area on a lead finger of the lead frame.

Another further aspect of the above embodiment provides that the second recess exposes the ground contact area on a tie bar connected to the die paddle of the lead frame.

Another further aspect of the above embodiment provides that the second recess exposes the ground contact area on the die paddle of the lead frame.

Another aspect of the above embodiment provides that the substrate includes a laminate substrate, and the semiconductor die is attached to a top surface of the laminate substrate.

A further aspect of the above embodiment provides that the second recess exposes the ground contact area on a bond pad on the top surface of the laminate substrate.

A still further aspect of the above embodiment provides that the second recess includes a trench recess that further exposes a strip of the top surface of the laminate substrate on either side of the bond pad.

Another aspect of the above embodiment provides that the packaged semiconductor device is one of a plurality of packaged semiconductor devices formed on a substrate array.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

It is noted that the term "neighboring" as used herein means "adjacent to" (e.g., next to and without an intervening object), and "laterally" as used herein means "in a sideways direction" (e.g., a horizontal direction that is parallel to a plane of the substrate). Also as used herein, the terms "approximately" and "about" mean a value close to or within an acceptable range of an indicated value, amount, or quality, which also includes the exact indicated value itself. Also as used herein, the term space indicates a void or volume in which material is absent. As used herein, the terms "substantial" and "substantially" mean sufficient to achieve the stated purpose or value in a practical manner, taking into account any minor imperfections or deviations, if any, that arise from usual and expected process abnormalities that may occur during wafer fabrication, which are not significant for the stated purpose or value.

Although the invention is described herein with reference to specific embodiments, various modifications and changes can be made without departing from the scope of the present invention as set forth in the claims below. For example, additional tiered TMV connections may be implemented in FIG. 1. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A packaged semiconductor device comprising:
    a substrate;
    a semiconductor die attached to a top surface of the substrate;
    a mold body formed over the substrate and surrounding the semiconductor die;
    a tiered through mold via (TMV) comprising:
        a first recess formed in the mold body, having a recessed surface within the mold body at a first depth, and
        a second recess formed in the mold body from the recessed surface to a second depth that exposes a ground contact area on a bonding area on the top surface of the substrate, wherein the first depth is greater than the second depth; and
    a metal shielding layer formed on a top surface of the mold body to form a shielded mold body, wherein the metal shielding layer makes direct contact with at least one sidewall of the first recess, with at least a portion of the recessed surface, with at least one sidewall of the second recess, and with the ground contact area,
    wherein:
        the substrate comprises a lead frame,
        the semiconductor die is attached to a top surface of a die paddle of the lead frame, and the second recess exposes the ground contact area on a lead finger of the lead frame.

2. The packaged semiconductor device of claim 1, wherein
    a top opening diameter of the second recess is less than a diameter of the recessed surface.

3. The packaged semiconductor device of claim 1, wherein
    a combined depth of the first and second depths is at least 5 times larger than a bottom opening diameter of the second recess.

4. The packaged semiconductor device of claim 1, wherein
    the second depth of the second recess is less than 500 microns.

5. The packaged semiconductor device of claim 1, wherein
    a portion of a first sidewall of the first recess is aligned with a portion of a second sidewall of the second recess.

6. The packaged semiconductor device of claim 1, wherein
    the first recess has at least one sidewall having a positive slope in a range of 0 to 20 degrees measured from a vertical plane.

7. The packaged semiconductor device of claim 1, wherein
    the second recess has at least one sidewall having a positive slope in a range of 0 to 20 degrees measured from a vertical plane.

8. The packaged semiconductor device of claim 1, wherein
    the first recess comprises one of a cylindrical shape, an oblong shape, a truncated conical shape, and a trench shape.

9. The packaged semiconductor device of claim 1, wherein the second recess comprises one of a cylindrical shape, an oblong shape, a truncated conical shape, and a trench shape.

10. A packaged semiconductor device comprising:
a substrate;
a semiconductor die attached to a top surface of the substrate;
a mold body formed over the substrate and surrounding the semiconductor die;
a tiered through mold via (TMV) comprising:
  a first recess formed in the mold body, having a recessed surface within the mold body at a first depth, and
  a second recess formed in the mold body from the recessed surface to a second depth that exposes a ground contact area on a bonding area on the top surface of the substrate, wherein the first depth is greater than the second depth;
a metal shielding layer formed on a top surface of the mold body to form a shielded mold body, wherein the metal shielding layer makes direct contact with at least one sidewall of the first recess, with at least a portion of the recessed surface, with at least one sidewall of the second recess, and with the ground contact area;
an antenna attached to the top surface of the substrate; and
a second mold body formed over and surrounding the antenna, wherein the second mold body is not covered by the metal shielding layer and is laterally separated from the shielded mold body by at least one trench recess.

11. The packaged semiconductor device of claim 10, wherein
at least one tiered TMV is formed between the antenna and the semiconductor die.

12. The packaged semiconductor device of claim 1 wherein the lead finger includes a tie bar connected to the die paddle of the lead frame.

13. The packaged semiconductor device of claim 12, wherein
the second recess exposes the ground contact area on the tie bar.

14. A packaged semiconductor device comprising:
a substrate;
a semiconductor die attached to a top surface of the substrate;
a mold body formed over the substrate and surrounding the semiconductor die;
a tiered through mold via (TMV) comprising:
  a first recess formed in the mold body, having a recessed surface within the mold body at a first depth, and
  a second recess formed in the mold body from the recessed surface to a second depth that exposes a ground contact area on a bonding area on the top surface of the substrate, wherein the first depth is greater than the second depth; and
a metal shielding layer formed on a top surface of the mold body to form a shielded mold body, wherein the metal shielding layer makes direct contact with at least one sidewall of the first recess, with at least a portion of the recessed surface, with at least one sidewall of the second recess, and with the ground contact area,
wherein:
  the substrate comprises a laminate substrate,
  the semiconductor die is attached to a top surface of the laminate substrate, and
  the second recess exposes a portion of a bond pad on the top surface of the laminate substrate, wherein the portion of the bond pad is the ground contact area.

15. The packaged semiconductor device of claim 14, wherein
the second recess comprises a trench recess that further exposes a strip of the top surface of the laminate substrate on either side of the bond pad.

16. The packaged semiconductor device of claim 1, wherein
the packaged semiconductor device is one of a plurality of packaged semiconductor devices formed on a substrate array.

17. A packaged semiconductor device comprising:
a substrate;
a semiconductor die attached to a top surface of the substrate;
a mold body formed over the substrate and surrounding the semiconductor die;
a tiered through mold via (TMV) comprising:
  a first recess formed in the mold body, having a recessed surface within the mold body at a first depth, and
  a second recess formed in the mold body from the recessed surface to a second depth that exposes a ground contact area on a bonding area on the top surface of the substrate, wherein the first depth is greater than the second depth; and
a metal shielding layer formed on a top surface of the mold body to form a shielded mold body, wherein the metal shielding layer makes direct contact with at least one sidewall of the first recess, with at least a portion of the recessed surface, with at least one sidewall of the second recess, and with the ground contact area,
wherein:
  the substrate comprises a lead frame,
  the semiconductor die is attached to a top surface of a die paddle of the lead frame, and the second recess exposes the ground contact area on the die paddle of the lead frame.

18. The packaged semiconductor device of claim 17, wherein
a combined depth of the first and second depths is at least 5 times larger than a bottom opening diameter of the second recess.

19. The packaged semiconductor device of claim 17, wherein
the second depth of the second recess is less than 500 microns.

20. The packaged semiconductor device of claim 17, wherein
the first recess has at least one sidewall having a positive slope in a range of 0 to 20 degrees measured from a vertical plane, and
the second recess has at least one sidewall having a positive slope in a range of 0 to 20 degrees measured from a vertical plane.

* * * * *